United States Patent
Mori et al.

[11] Patent Number: 5,828,564
[45] Date of Patent: Oct. 27, 1998

[54] RECTIFIER HEAT DISSIPATION

[75] Inventors: Masakazu Mori; Shiro Iwatani; Shinji Iwamoto, all of Tokyo, Japan

[73] Assignee: Mitsubishi Denki Kabushiki Kaisha, Tokyo, Japan

[21] Appl. No.: 911,003

[22] Filed: Aug. 14, 1997

[30] Foreign Application Priority Data

Feb. 25, 1997  [JP]  Japan .................................. 9-040936

[51] Int. Cl.⁶ .......................... H02M 1/00; H01L 23/34; H02K 11/00
[52] U.S. Cl. ......................... 363/141; 363/145; 257/722; 310/68 D
[58] Field of Search ................ 363/141, 144, 363/145; 257/720, 722; 310/71, 68 D

[56] References Cited

U.S. PATENT DOCUMENTS

| | | | |
|---|---|---|---|
| 4,007,402 | 2/1977 | Allport | 257/722 |
| 4,057,825 | 11/1977 | Narita et al. | 257/720 |
| 4,538,169 | 8/1985 | Smith et al. | 257/658 |
| 4,546,409 | 10/1985 | Yoshino et al. | |
| 5,610,439 | 3/1997 | Hiyoshi et al. | 257/688 |
| 5,659,212 | 8/1997 | DePetris | 310/68 D |

FOREIGN PATENT DOCUMENTS

| | | |
|---|---|---|
| 60-87675 | 5/1985 | Japan . |
| 934185 | 8/1963 | United Kingdom . |
| 2 014 360 | 12/1978 | United Kingdom . |

*Primary Examiner*—Stuart N. Hecker
*Attorney, Agent, or Firm*—Sughrue, Mion, Zinn, Macpeak & Seas, PLLC

[57] ABSTRACT

A rectifier excellent in terms of heat sink performance, product quality, and cost including a one-way conducting device for rectifying an alternating current, wherein the one-way conducting device includes a metal base serving as one electrode and having a side surface portion and a seating surface portion; and a metal heat dissipation member, including a socket section for receiving the metal base, for dissipating heat generated at the one-way conductive device, wherein the socket section of the metal heat dissipation member has a side wall portion firmly engaged with the side surface portion of the metal base and a bottom portion in contact with the seating surface portion of the metal base.

7 Claims, 4 Drawing Sheets

RECTIFIER HEAT DISSIPATION

BACKGROUND OF THE INVENTION

1. Field of the Invention

The present invention relates to a rectifier used in an alternating current generator assembly mounted on a vehicle.

2. Description of the Related Art

FIG. 5 is a schematic diagram showing an alternating current generator assembly for use in a vehicle. The generator assembly comprises an alternator 1 including an armature coil 101 and a field coil 102, and a rectifier 2 including a positive-side rectifier unit 201 and a negative-side rectifier unit 202. The generator assembly further comprises a voltage regulator 3, a storage battery 4, a key switch 5, and an electric load 6.

FIG. 6 is a detailed sectional view showing the positive-side rectifier unit 201 of the rectifier. The positive-side rectifier unit 201 comprises a plurality of rectifying diodes 211 as one-way conductive devices electrically and mechanically connected to a heat sink 301 as a heat dissipation member that also serves as an output terminal. Each rectifying diode 211 comprises an anode electrode 211a, an unshown diode chip molded in a mold resin 211b and electrically connected to the anode electrode 211a, and a metal base 211c serving as a cathode electrode and connected to the diode chip.

The metal base 211c is planar and has on its one principal surface the diode chip molded in the mold resin 211b. The rectifying diode 211 is connected to the heat sink 301 with the other principal surface of the metal base 211c soldered onto the heat sink 301 using solder 211d.

FIG. 7 is a sectional view showing the structure of the positive-side rectifier unit of another conventional rectifier. In the positive-side rectifier unit, a plurality of rectifying diodes 221 are electrically and mechanically connected to a heat sink 302 that also serves as a positive output terminal.

Each rectifying diode 221 comprises an anode electrode 221a, an unshown diode chip molded in a mold resin 221b and electrically connected to the anode electrode 221a, and a metal base 221c serving as a cathode electrode and connected to the diode chip.

The metal base 221c is planar and has on its one principal surface the diode chip molded in the mold resin 221b. The circumference of the metal base 221c is knurled. The heat sink 302 has through-holes 302a. The rectifying diode 221 is secured with its metal base 221c having the knurled circumference press-fitted into the through-hole 302a.

In the vehicular alternating current generator assembly thus constructed, with the key switch 5 turned on, a current flows from the storage battery 4 to the field coil 102 while it rotates. When the field coil 102 rotates, three-phase alternating currents are generated in the armature coil 101. The alternating currents flows to the rectifier 2 to be full-wave rectified there. A current output by the positive-side rectifier unit 201 is fed to the electric load 6 and the storage battery 4.

In the positive-side rectifier unit 201 of the rectifier 2 in the vehicular alternating current generator assembly, the plurality of rectifying diodes 211 and 221 are connected to the heat sink 301 and 302, respectively, each of which also serves as the positive output terminal, and heat generated by the rectifying diodes 211, 221 are dissipated via the heat sink 301 or 302, respectively.

In such a conventional rectifier shown in FIG. 6, solderability and high thermal conductivity are required of the material of the heat sink 301. Although one of the candidate materials is copper, the use of copper will increase the weight of the rectifier, contrary to the purpose of light weight design. Aluminum is available as another candidate material. Although aluminum contributes to light weight design, it needs to be nickel-plated for solderability. This involves more manufacturing steps and pushes up manufacturing cost.

In the rectifier shown in FIG. 6, the diodes may suffer damage when they are heated at high temperature during a soldering operation. Flux used in the soldering operation will contaminate the diodes, degrading their performance and thus quality of the rectifier itself.

The rectifier shown in FIG. 7 is free from the above solder-related problem, because the metal base 221c of the rectifying diode 221 is press-fitted into the through-hole 302a. However, the underside of the metal base 221c fitted in the through-hole 302a remains out of contact with the heat sink 302. For this reason, no thermal conduction takes place from the underside of the metal base 221c to the heat sink 302, and heat sink performance thus drops.

SUMMARY OF THE INVENTION

Accordingly, it is an object of the present invention to provide a rectifier which is excellent in terms of heat sink performance, product quality, and cost.

According to a first aspect of the present invention, the rectifier comprises: a one-way conducting device for rectifying an alternating current, wherein the one-way conducting device includes a metal base serving as one electrode and having a side surface portion and a seating surface portion; and a metal heat dissipation member, including a socket section for receiving the metal base, for dissipating heat generated at the one-way conductive device, wherein the socket section of the metal heat dissipation member has a side wall portion firmly engaged with the side surface portion of the metal base and a bottom portion in contact with the seating surface portion of the metal base.

According to a second aspect of the present invention, the metal base of the one-way conducting device has surface irregularity on the side surface portion.

According to a third aspect of the present invention, the metal base of the one-way conducting device has surface irregularity on the seating surface portion.

According to a fourth aspect of the present invention, a thermally conductive member which is softer than each of the metal base and the metal heat dissipation member is interposed between the seating surface portion of the one-way conductive device and the socket section of the metal heat dissipation member.

According to a fifth aspect of the present invention, the thermally conductive member is a metal.

According to a sixth aspect of the present invention, the thermally conductive member is a metal having a melting point lower than the melting point of each of the metal base and the metal heat dissipation member, and the thermally conductive member is melted after being interposed and is then again solidified.

According to a seventh aspect of the present invention, the thermally conductive member is a thermally conductive resin.

DESCRIPTION OF THE PREFERRED EMBODIMENTS

First Embodiment

Figure 1:
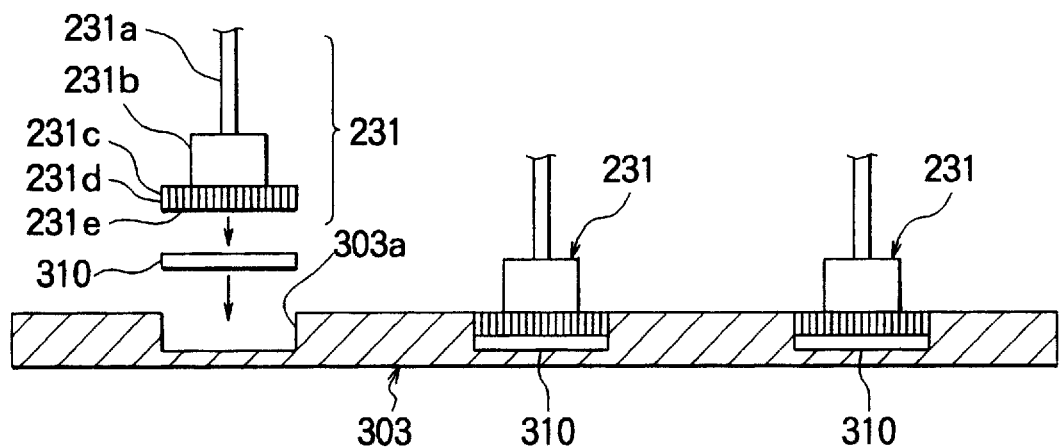
FIG. 1 is a sectional view showing the positive-side rectifier unit according to one embodiment of the rectifier of the present invention.

FIG. 1 is a sectional view showing the positive-side rectifier unit according to one embodiment of the rectifier of the present invention. The positive-side rectifier unit comprises a plurality of rectifying diodes 231 as one-way conductive devices electrically and mechanically connected to a heat sink 303 as a heat dissipation member that also serves as an output terminal.

Each rectifying diode 231 comprises an anode electrode 231a, an unshown diode chip molded in a mold resin 231b and electrically connected to the anode electrode 231a, and a metal base 231c serving as a cathode electrode and connected to the diode chip.

The metal base 231c is a copper disk, for example, and has on its one principal surface the diode chip molded in the mold resin 231b. The side surface portion 231d of the metal base 231c is knurled with an irregularity that runs in parallel with the axis of the metal base 231c. The heat sink 303 is a plate manufactured of aluminum, for example, and is provided with circular socket sections 303a on its top side. A soft and highly thermally conductive metal plate 310 manufactured of indium, for example, is interposed between a seating surface portion 231e of the metal base 231c and the heat sink 303. The metal base 231c is press-fitted into the socket section 303a with the metal plate 310 therebetween.

In the rectifier thus constructed, the soft and highly thermally conductive metal plate 310 is interposed between the seating surface portion 231e of the metal base 231c and the heat sink 303. The metal base 231c is press-fitted into the socket section 303a. The surfaces of the soft metal plate 310 are plastically deformed following the configuration of the seating surface portion 231e and the bottom portion of the socket section 303a so that the soft metal plate 310 is securely in contact with both the metal base 231c and the heat sink 303. The side surface portion 231d of the metal base 231c is engaged with the side wall portion of the socket section 303a. With this arrangement, thermal conduction from the metal base 231c to the heat sink 303 is improved. Since no solder is employed as connection means, manufacturing steps are not increased and manufacturing cost is reduced. Since no solder is used, the rectifier is free from flux contamination arising from soldering, and the quality degradation of the rectifier due to such contamination is avoided.

Light weight design is achieved by manufacturing the heat sink 303 of aluminum. Aluminum offers a good machinability, and is thus easy to machine. With no solder employed, aluminum needs no nickel plating, avoiding an increase in manufacturing steps.

The acceptable candidates for the metal plate 310 are a relatively soft and low melting point metal, for example, tin, tin alloy, tin-lead solder, lead, or the like. The metal plate 310 is squeezed between the metal base 231c and the heat sink 303 to be securely in contact with both of these.

In an alternative method, a relatively low melting point metal such as tin, tin alloy, solder, lead, or the like may be used for the metal plate 310, the metal plate 310 is interposed and then squeezed between the metal base 231c and the heat sink 303, and the metal plate 310 is then heated until it is melted and is solidified. The metal plate 310 may be melted and then solidified with the heat sink 303 in its upright position with its left-hand side up in FIG. 1, for example. In this case, the metal plate 310 may suffer localized gaps with its surfaces not entirely in contact with the metal base 231c and the heat sink 303 after the metal plate 310 is squeezed therebetween. When the metal plate 310 is melted, the gap is filled with the molten metal plate 310, and a new gap equal to the volume of the previous gaps collect at the top of the molten metal plate 310. Thus, the solidified metal plate 310 in its wider area is put into contact with the metal base 231c and the heat sink 303, assuring thermal conduction from the metal base 231c to the heat sink 303.

The metal plate 310 may be replaced with a thermally conductive resin such as silicone compound. A thermally conductive resin paste is applied to the socket section 303a of the heat sink 303, and then the metal base 231c is press-fitted into the heat sink 303 with the thermally conductive resin paste interposed therebetween. The thermally conductive resin is elastically deformed following the configuration of the metal base 231c and the bottom portion of the socket section 303a and is thus put into secure contact with the metal base 231c and the socket section 303a. The thermally conductive resin paste is easy to handle in manufacturing because it is simply applied to the heat sink 303, and will not come off the heat sink 303.

Second Embodiment

Figure 2:
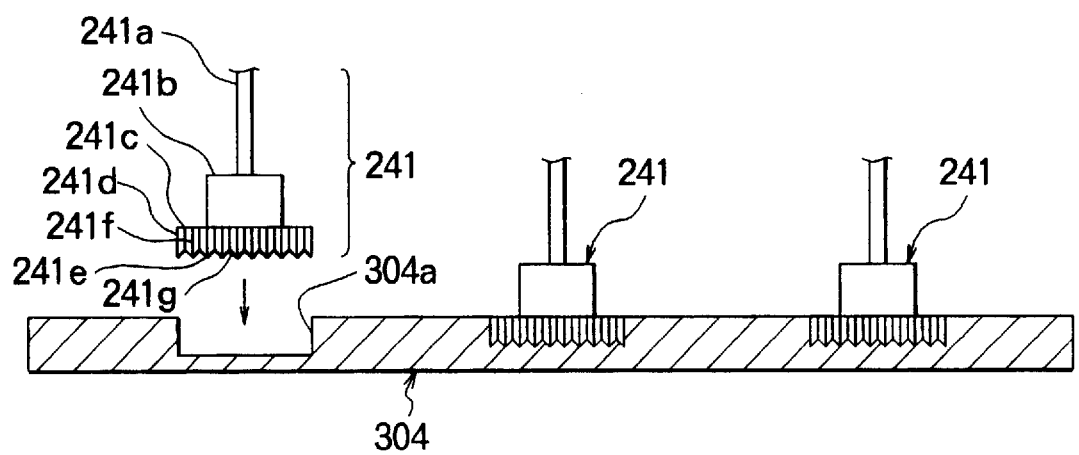
FIG. 2 is a sectional view showing the positive-side rectifier unit according to another embodiment of the rectifier of the present invention.

FIG. 2 is a sectional view showing the positive-side rectifier unit according to a second embodiment of the rectifier of the present invention. The positive-side rectifier unit comprises a plurality of rectifying diodes 241 as one-way conductive devices electrically and mechanically connected to a heat sink 304 as a heat dissipation member that also serves as an output terminal.

Each rectifying diode 241 comprises an anode electrode 241a, an unshown diode chip molded in a mold resin 241b and electrically connected to the anode electrode 241a, and a metal base 241c serving as a cathode electrode and connected to the diode chip.

The metal base 241c is a copper disk, for example, and has on its one principal surface the diode chip molded in the mold resin 241b. The side surface portion 241d of the metal base 241c is knurled with an irregularity 241f and a seating surface portion 241e of the metal base 241c is knurled by machining, thus having a plurality of periodic linear projections 241g at predetermined intervals running across the diameter of the metal base 241c and having triangular shapes in cross section. The heat sink 304 is an aluminum plate, for example, and has socket sections 304a on its top side. Each metal base 241c is press-fitted into the corresponding socket section 304a for connection therewith.

In the rectifier thus constructed, the side surface portion 241d of the metal base 241c is knurled, thus having the irregularity 241f. The metal base 241c is press-fitted into the socket section 304a. The side surface portion 241d of the metal base 241c is engaged with the side wall portion of the socket section 304a and the linear projections 241g on the seating surface portion 241e are engaged with the bottom portion of the socket section 304a. The metal base 241c is thus reliably connected to the heat sink 304 without the need for soldering. No gap occurs between the metal base 241c and the heat sink 304, the contact area therebetween is increased, and the thermal conduction therebetween is enhanced. Since no solder is used, neither the manufacturing steps nor manufacturing cost is increased. The quality of the rectifier is maintained because no flux is used.

Figure 7:
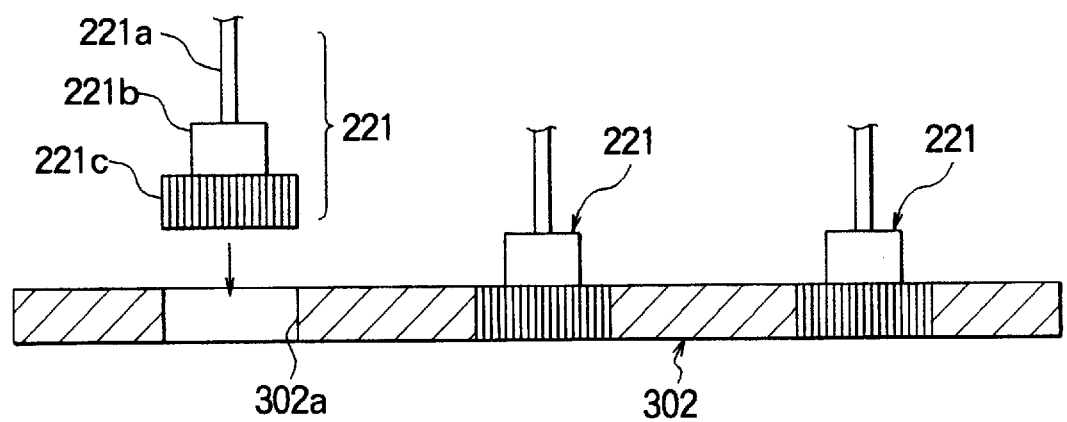
FIG. 7 is a sectional view showing the structure of the positive-side rectifier unit of another conventional rectifier.

Although in this embodiment, the projections 241g are formed on the seating surface portion 241e of the metal base 241c, the present invention is not limited to this method. In comparison with the conventional method shown in FIG. 7, the metal base 241c without the projections 241g still offers an increased contact area between the metal base 241c and the heat sink 304, thereby increasing heat sink performance. The same effect may be achieved if the seating surface portion 241e is provided with linear projections of triangular shape in cross section that radially run from the center or concentric circular projections of triangular shape in cross section.

Third Embodiment

Figure 3:
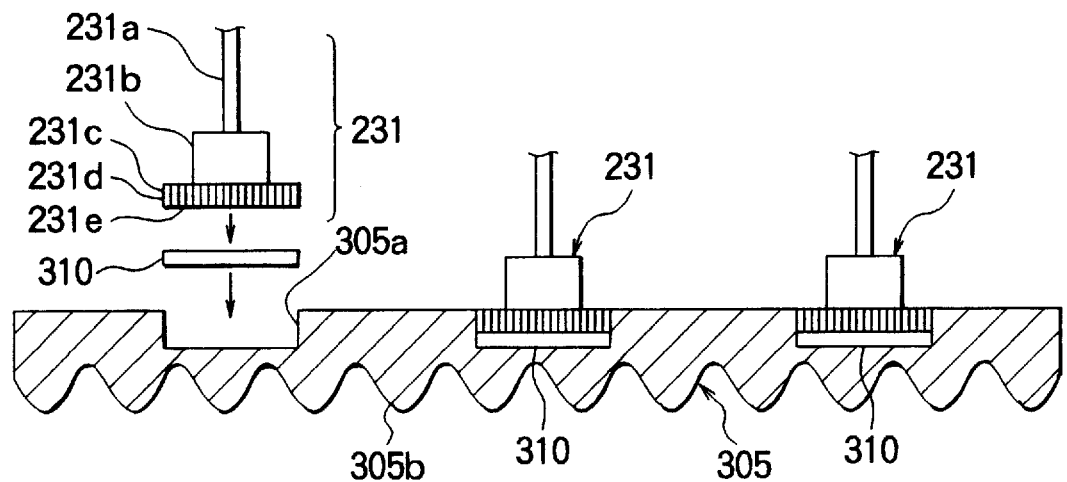
FIG. 3 is a sectional view showing the positive-side rectifier unit according to yet another embodiment of the rectifier of the present invention.

FIG. 3 is a sectional view showing the positive-side rectifier unit according to a third embodiment of the rectifier of the present invention. In this embodiment, the metal base 231c of each rectifying diode 231 is press-fitted into a respective socket section 305a formed in the top side of a heat sink 305. The entire underside of the heat sink 305 opposite the rectifying diode 231 is provided with a plurality of wavy heat dissipation fins 305b. The rest of the construction of the third embodiment remains identical to that of the first embodiment.

In the rectifier thus constructed, the entire underside side of the heat sink 305 opposite the rectifying diodes 231 has the heat dissipation fins 305b. The heat dissipation fins may be formed on the same side of the heat sink 305 bearing the rectifying diodes 231, except the mounting positions of the rectifying diodes 231. With this arrangement, heat sink performance is even further enhanced.

Fourth Embodiment

Figure 4:
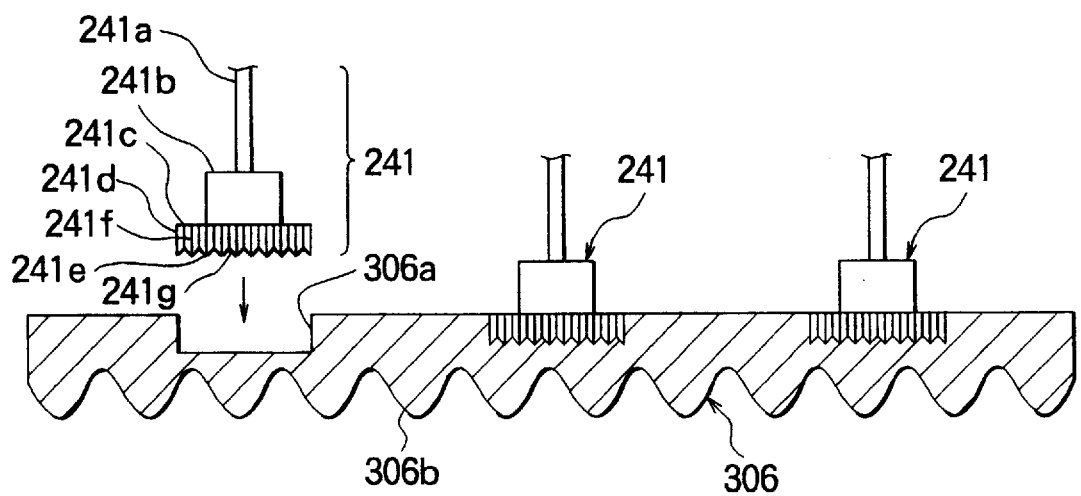
FIG. 4 is a sectional view showing the positive-aide rectifier unit according to yet another embodiment of the rectifier of the present invention.
Figure 5:
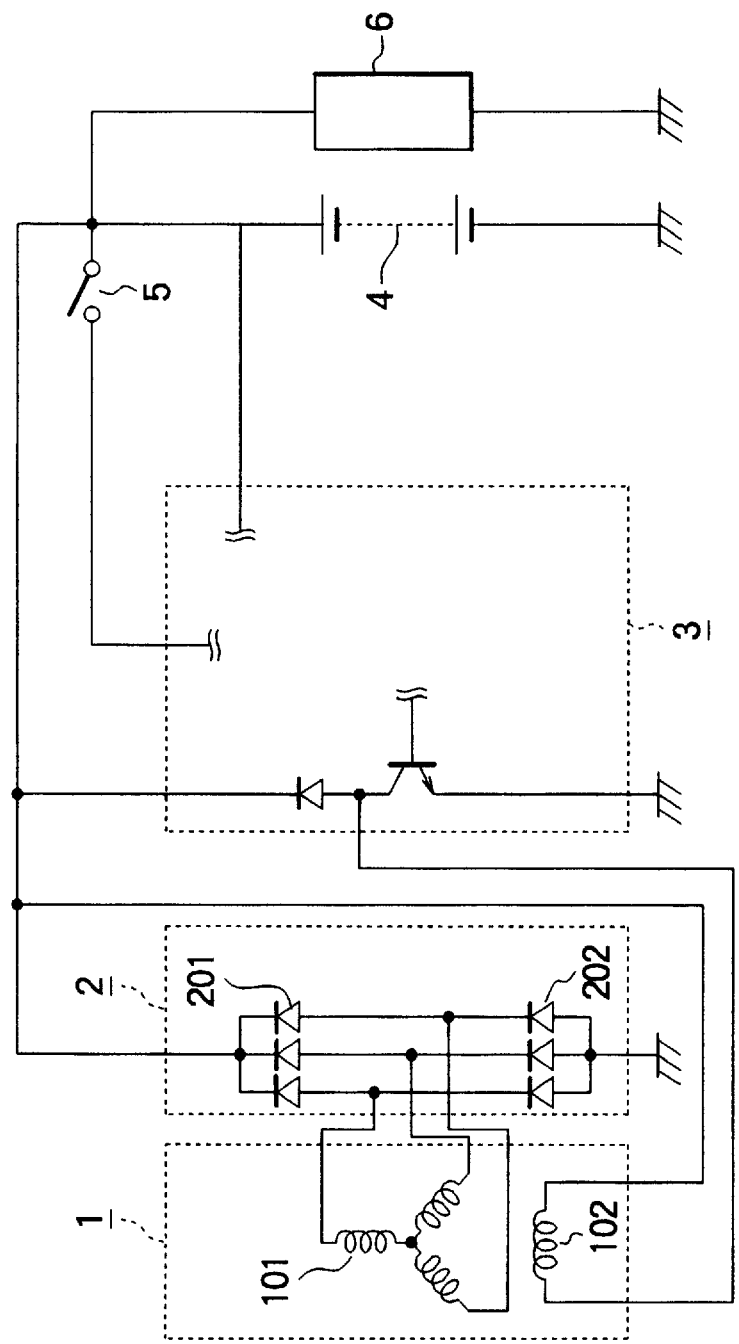
FIG. 5 is a schematic diagram of an alternating current generator assembly for use in a vehicle.
Figure 6:
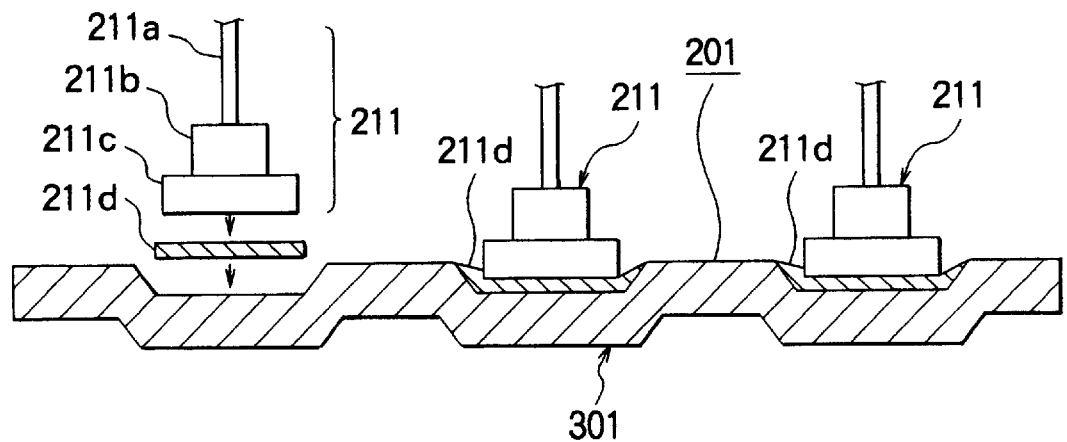
FIG. 6 is a detailed sectional view showing the positive-side rectifier unit of a conventional rectifier.

FIG. 4 is a sectional view showing the positive-aide rectifier unit according to a fourth embodiment of the rectifier of the present invention. In this embodiment, the metal base 241c of each rectifying diode 241 is press-fitted into a respective socket section 306a formed in the top side of a heat sink 306. The entire underside of the heat sink 306 opposite the rectifying diode 241 is provided with a plurality of wavy heat dissipation fins 306b. The rest of the construction of the third embodiment remains identical to that of the second embodiment.

In the rectifier thus constructed, the entire underside of the heat sink 306 has the heat dissipation fins 306b, and thus the fourth embodiment offers the dissipation effect as the third embodiment.

According to the first aspect of the present invention, the rectifier comprises: the one-way conducting device for rectifying the alternating current, wherein the one-way conducting device includes the metal base, serving as one electrode and having the side surface portion and the seating surface portion; and the metal heat dissipation member, including the socket section for receiving the metal base, for dissipating heat generated at the one-way conductive device, wherein the socket section of the metal heat dissipation member has the side wall portion firmly engaged with the side surface portion of the metal base and the bottom portion in contact with the seating surface portion of the metal base. The contact area between the metal base and the heat dissipation member increases, thereby improving heat sink performance. Since the metal base is connected to the heat sink without the need for soldering, neither the manufacturing steps nor manufacturing cost is increased. The quality of the rectifier is maintained because no flux is used.

According to the second aspect of the present invention, the metal base of the one-way conducting device has surface irregularity on the side surface portion. For this reason, the side surface portion of the metal base is reliably engaged with the side wall portion of the heat dissipation member. Heat sink performance is further improved.

According to the third aspect of the present invention, the metal base of the one-way conducting device has surface irregularity on the seating surface portion. For this reason, the seating surface portion of the metal base is reliably engaged with the bottom portion of the heat dissipation member. Heat sink performance is further improved.

According to the fourth aspect of the present invention, the thermally conductive member which is softer than each of the metal base and the metal heat dissipation member is interposed between the seating surface portion of the one-way conductive device and the socket section of the metal heat dissipation member. The thermally conductive member in its wide area remains in contact with the metal base and the heat dissipation member, thermal resistance between the metal base and the heat dissipation member is decreased, and thus heat sink performance is improved.

According to the fifth aspect of the present invention, the thermally conductive member is a metal. When the thermally conductive member is squeezed between the metal base and the heat dissipation member, it is firmly in contact with both the metal base and the heat dissipation member.

According to the sixth aspect of the present invention, the thermally conductive member is a metal having a melting point lower than the melting point of each of the metal base and the metal heat dissipation member, and the thermally conductive member is melted after being interposed and then again solidified. Even when the thermal conductive member suffers localized gaps with its surfaces not entirely in contact with the metal base and the heat sink after the metal plate is squeezed therebetween, the gap is filled with the molten thermally conductive member when it is melted. The solidified thermally conductive member in its wider area is put into contact with the metal base and the heat sink, assuring thermal conduction from the metal base to the heat sink.

According to the seventh aspect of the present invention, the thermally conductive member is a thermally conductive resin. The thermally conductive resin is easily applied onto the heat sink, thereby contributing to manufacturing efficiency. The thermally conductive resin may also work as a bond, securing the rectifying diodes to the heat sink and increasing reliability of the rectifier.

What is claimed is:

1. A rectifier comprising:

a one-way conducting device for rectifying an alternating current, wherein said one-way conducting device includes a metal base serving as one electrode and having a side surface portion and a seating surface portion; and a metal heat dissipation member, including a socket section for receiving said metal base, for dissipating heat generated at said one-way conductive device, wherein said socket section of said metal heat dissipation member has a side wall portion firmly engaged with said side surface portion of said metal base and a bottom portion in contact with said seating surface portion of said metal base.

2. A rectifier according to claim 1, wherein said metal base of said one-way conducting device has surface irregularity on said side surface portion.

3. A rectifier according to claim 2, wherein said metal base of said one-way conducting device has surface irregularity on said seating surface portion.

4. A rectifier according to claim 1, wherein a thermally conductive member which is softer than each of said metal base and said metal heat dissipation member is interposed between said seating surface portion of said one-way conductive device and said socket section of said metal heat dissipation member.

5. A rectifier according to claim 4, wherein said thermally conductive member is a metal.

6. A rectifier according to claim 5, wherein said thermally conductive member is a metal having a melting point lower than the melting point of each of said metal base and said metal heat dissipation member, and wherein said thermally conductive member is melted after being interposed and is then again solidified.

7. A rectifier according to claim 4, wherein said thermally conductive member is a thermally conductive resin.

\* \* \* \* \*